(12) United States Patent
Mader et al.

(10) Patent No.: US 6,618,408 B1
(45) Date of Patent: Sep. 9, 2003

(54) DIRECT-DRIVE MODULATOR DRIVER

(75) Inventors: Tom Mader, San Jose, CA (US); Craig Schulz, Fremont, CA (US); Bob DeBoo, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/819,355

(22) Filed: Mar. 27, 2001

(51) Int. Cl.[7] .................................................. H01S 3/10

(52) U.S. Cl. ..................................................... 372/38.02

(58) Field of Search ....................................... 372/38.02

(56) References Cited

U.S. PATENT DOCUMENTS 4,698,817 A * 10/1987 Burley ..................... 372/38.02
6,021,144 A * 2/2000 Meyer et al. ............ 372/38.02

* cited by examiner

*Primary Examiner*—James Davie
(74) *Attorney, Agent, or Firm*—Blakely, Sokoloff, Taylor & Zafman LLP

(57) ABSTRACT

A direct-drive modulator driver and an optical transponder including the driver are disclosed. The driver includes a transistor having a first terminal, a second terminal and an input terminal, where said first terminal is grounded. The driver further comprises of a laser diode having a p-terminal and an n-terminal, where said p-terminal is coupled to a power supply, and said n-terminal is coupled to the second terminal of the transistor. The driver further comprises of an input load coupled to the input terminal of the transistor.

17 Claims, 8 Drawing Sheets

DIRECT-DRIVE MODULATOR DRIVER

FIELD OF THE INVENTION

The present invention pertains to the field of communication. More particularly, this invention pertains to the field of optical fiber communication system.

BACKGROUND OF THE INVENTION

Fiber optics has become one of the most important technologies in communication. It is both fast and reliable to use optical fiber in data transmission. Thus, optical fiber is widely utilized in high-speed telecom and datacom systems. These systems are made up of multiple components, including optical transponders. An optical transponder is a receiver-transmitter activated for transmission by reception of a predetermined signal in a fiber optic communication system, providing an interface between a photonic physical layer and an electrical section layer in the system.

Typically, an optical transponder includes an electrical driver that amplifies an optoelectric signal and drives it onto a transmission device. Prior art implementations of optical transponders use discrete components that include a driver and optical devices in separate packages. Discrete devices consume a lot of space and the performance of the resultant system is inefficient. However, in the prior art, putting the driver and the optical devices together in the same package is also undesirable because of high power consumption, typically 1.5W or greater. Thus, to improve performance and save space, which in turn reduces cost, a low power driver is desired that can be packaged together with other components of an optical transponder.

Prior-art high speed fiber-optic driver amplifiers utilize a transmission-line interface between the driver output and the laser diode input, which allows the two components to be physically separated by a moderate distance (few millimeters up to several centimeters for 10 Gb/s transmitters).

Another issue with a fiber optic communication system is the difficulty in scaling up and automating optical components in the system. The difficulties limit the bandwidth of a communication network.

SUMMARY OF THE INVENTION

A direct-drive modulator driver and an optical transponder incorporating the driver are described. The driver includes a transistor having a first terminal, a second terminal and a input terminal. The first terminal is grounded. The driver further includes a laser diode having a p-terminal and an n-terminal. The p-terminal is connected to a power supply, and the n-terminal is connected to the second terminal of the transistor. The driver further includes an input load connected to the input terminal of the transistor.

Other features and advantages of the present invention will be apparent from the accompanying drawings and from the detailed description that follows below.

BRIEF DESCRIPTION OF THE DRAWINGS

The invention is illustrated by way of example and not limitation in the figures of the accompanying drawings, in which like references indicate similar elements, and in which.

DETAILED DESCRIPTION

A direct-drive modulator driver, an integrated driver and laser diode, and an optical transponder incorporating the driver are disclosed. The driver amplifier (consisting of high-speed transistors and other components) is packaged in close physical proximity to the laser diode (e.g., approximately 1 mm spacings in one embodiment). The driver amplifier is directly coupled to the laser diode. Such a direct-coupling eliminates the transmission-line interface, thereby eliminating degradations due to the transmission-line and resulting in improved high-speed performance, smaller size, reduced cost, and importantly, significantly reduced power consumption.

In one embodiment, the driver includes a transistor having a first terminal, a second terminal and an input terminal, where the first terminal is grounded. The driver also includes a laser diode having a p-terminal and an n-terminal, where the p-terminal is connected to a power supply, and the n-terminal is connected to the second terminal of the transistor. The driver also includes an input load connected to the input terminal of the transistor.

In the following description, numerous details are set forth, such as types of semiconductor devices, range of resistance, etc. It will be apparent, however, to one skilled in the art, that the present invention may be practiced without these specific details. In other instances, well-known structures and devices are shown in block diagram form, rather than in detail, in order to avoid obscuring the present invention.

Figure 1:
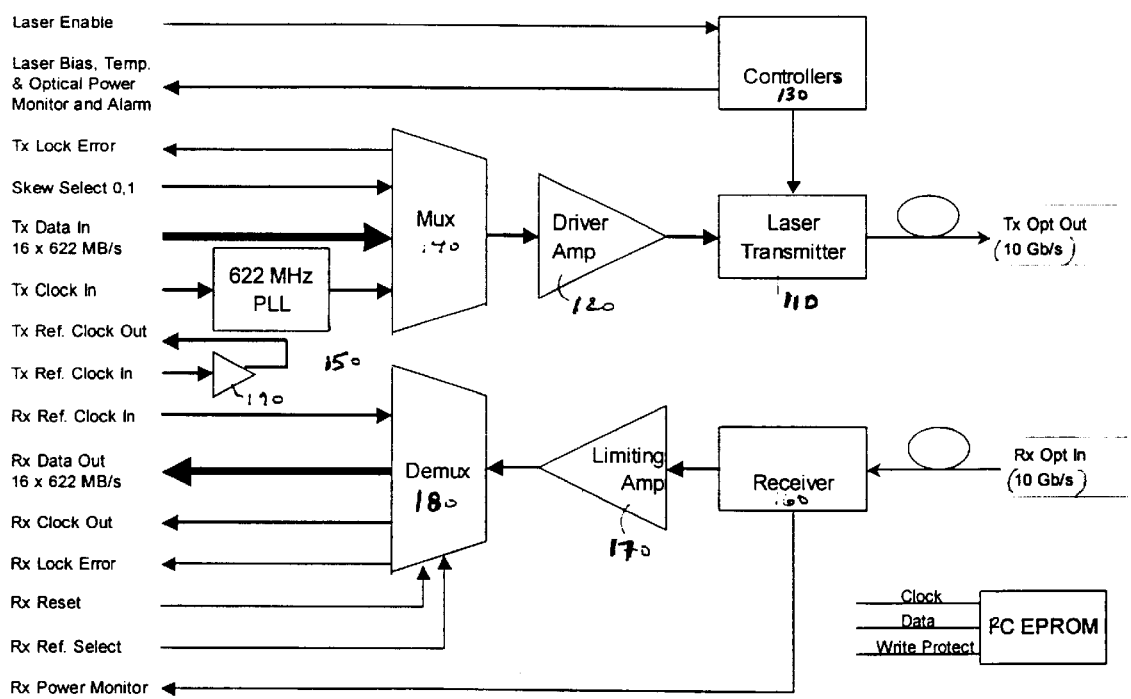
FIG. 1 shows one embodiment of an optical transponder.

FIG. 1 shows one embodiment of an optical transponder. The transponder 100 includes a transmitter 101 and a receiver 102. The transmitter 101 includes a MUX 140, a direct-drive modulator driver 120, an optic transmitter 110, a 622 MHz PLL 150, and TEC/LD controllers 130. The MUX 140 multiplexes 16 channels at 622 Mb/s into a 10 Gb/s optical signal. The 622 MHz PLL 150 provides a transmission clock signal to the MUX 140. The output of the MUX 140 is fed into a direct-drive modulator driver 120. The output of the driver 120 is fed into the optic transmitter 110, whose output is launched into a single-mode optical fiber pigtail in response to control signals from controller 130.

The receiver 102 includes a receiver 160, a limiting amplifier 170, a demultiplexer (DeMUX) 180 and a buffer 190. In one embodiment, DeMux 180 include clock and data recovery (CDR) funtionality. The receiver 160 receives a 10 Gb/s signal and feeds it into the limiting amplifier 170. The output of the limiting amplifier 170 goes into the DeMUX 180, which demultiplexes the single 10 Gb/s optical signal to 16 channel parallel 622 Mbps LVDS electrical signals. A reference clock signal is provided to the DeMUX 180 through buffer 190.

In one embodiment, the receiver operates over within both the 1.3 mm to 1.5 mm bands and is compliant to SONET/SDH OC-192/STM-64 physical layer specifications to provide 10 Gbps. However, the implementation of the transponder is not limited to the specific parameters given, such as the number of channels, the transmission rate, etc. The numbers given above are for illustrative purpose only. Furthermore, the integrated driver may be used in OC-768 systems capable of transferring data at 40 Gbps.

Furthermore, it will be apparent to one of ordinary skill in the art to implement the transponder with other similar components. The optical transponder is used in optical fiber communication system to provide an interface between a photonic physical layer and an electrical section layer in the system. The high-speed signal conversion of the transponder improves the bandwidth of the communication system. In particular, the optical transponder can be applied to gigabit switch routers, add/drop multiplex equipment, digital cross-connect equipment or other WDM and non-WDM metro system equipment.

Figure 2:
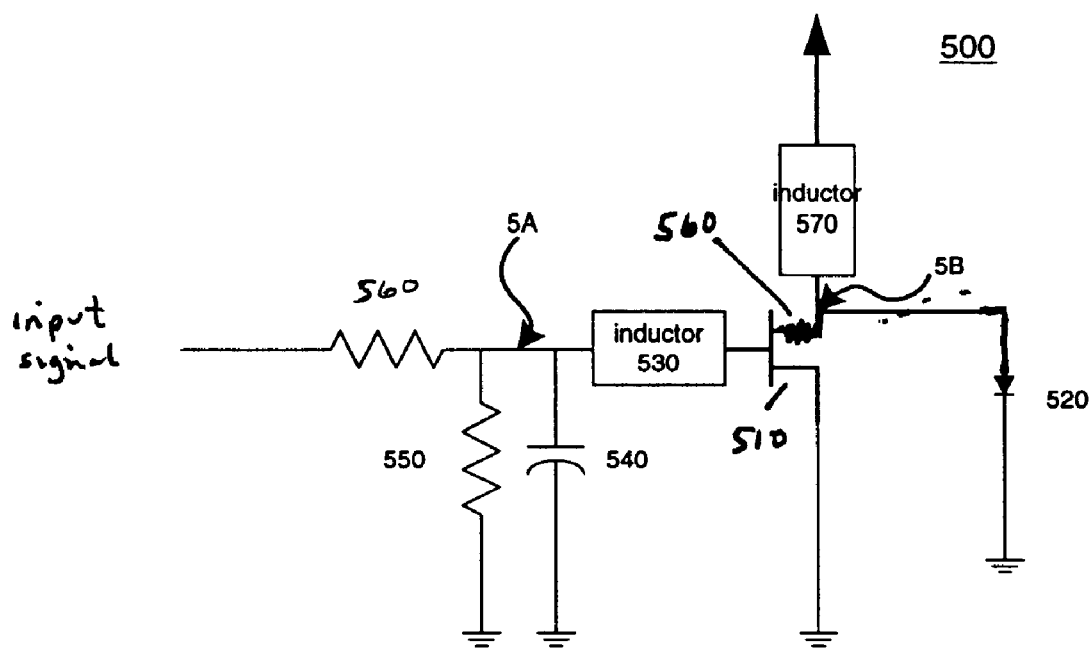
FIG. 2 shows one embodiment of the direct-drive modulator driver.

The direct-drive modulator driver in the optical transponder can be implemented in various ways. FIG. 2 shows a circuit diagram of an embodiment of the direct-drive modulator driver. Transistor 510 has a gate terminal (or the base terminal, depending on the type of transistor used), a drain and a source. The source of transistor 510 is grounded. The drain of transistor 510 is connected to inductor 570 and is coupled to a terminal of laser diode 520. In one embodiment, an optical damping resistor 560 may be used to connect transistor 510 to laser diode 520. Another terminal of laser diode 520 is connected to ground. Inductor 570 is also connected to an external power supply. An input load, made up of a combination of resistors (resistor 550 and resistor 560), inductor 530 and capacitor 540, is connected between an input signal and transistor 510. Inductor 530 is connected between node 5A and the gate terminal of transistor 510. Capacitor 540 is connected between node 5A and ground. Resistor 550 is connected between node 5A and ground. Resistor 560 is connected to node 5A. An input signal is applied to the other end of resistor 560 to drive transistor 510. Transistor 510 generates an amplified current through the other terminals of it, proportional to the input signal. The direct connection of the transmitter output terminals to the laser diode allows an increase of performance (because of the lower required output voltage swing) while at the same time causing a power reduction. Both the performance increase and the power reduction are a direct result of the removal of any transmission-line interface between the driver circuit and the laser diode.

In one embodiment, resistor 550 has a resistance of 50 ohms, and resistor 560 has a resistance of 10 ohms. In one embodiment, transistor 510 is a PHEMT. In another embodiment, transistor 510 is a HBT. The bias point between laser diode 520 and transistor 510 is at an active node, but split ground plane biasing is not required. The embodiment in FIG. 2 also has a low impedance point. However, since the current switches locally between transistor 510 and laser diode 520 to form a constant-current supply scheme, there is less electromagnetic interference in this embodiment then in the prior art.

Figure 3:
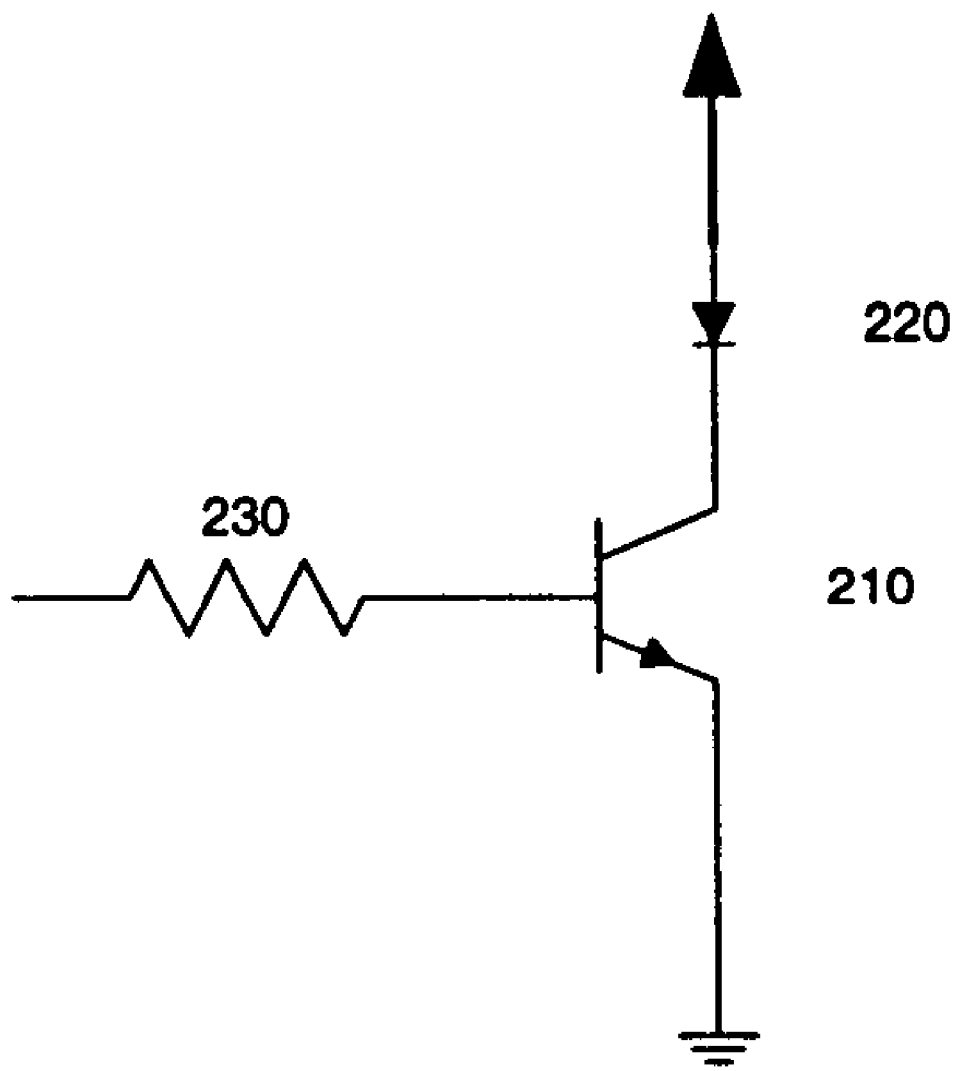
FIG. 3 shows two alternate implementations of split ground plane biasing technique.

FIG. 3 shows a circuit diagram of an alternate embodiment of the direct-drive modulator driver 200. The collector of a heterojunction bipolar transistor (HBT) 210 is connected to the n-terminal of a laser diode 220. The p-terminal of the diode is connected to an external power supply. A resistor 230 is connected to the base terminal of HBT 210. An input signal is applied to the other terminal of resistor 230. The input signal supplies a base current to HBT 210. HBT 210 then generates an amplified collector current proportional to the base current. Laser diode 220 provides a bias to HBT 210. In another embodiment, a pseudomorphic high electron mobility transistor (PHEMT) is used instead of a HBT.

In one embodiment, the transistor acts as an internal current source in order to suppress inductive ringing in the laser diode and, thus, produces overshoot. In one embodiment, the external power supply is set at 3.3V in order to reduce power consumption of the driver and make it compatible with other low power circuitries. The power consumption of the direct-drive modulator driver can be approximately 0.4W. The typical power consumption of prior designs of driver in a transponder is about 1.8W. Thus, a reduction of 1.4W in power consumption is achieved.

Figure 4:
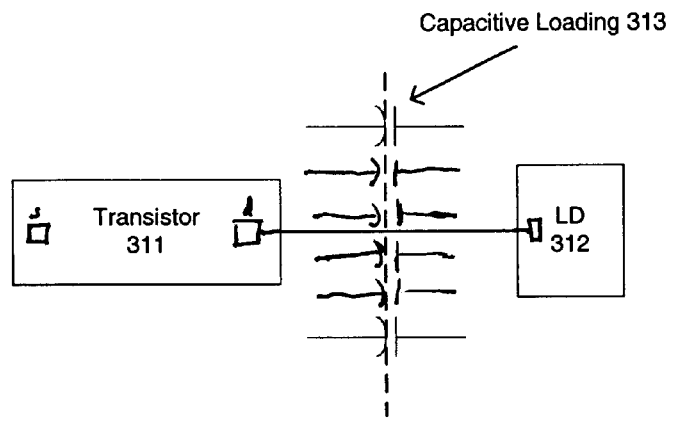
FIG. 4 shows one embodiment of the direct-drive modulator driver.
Figure 4:
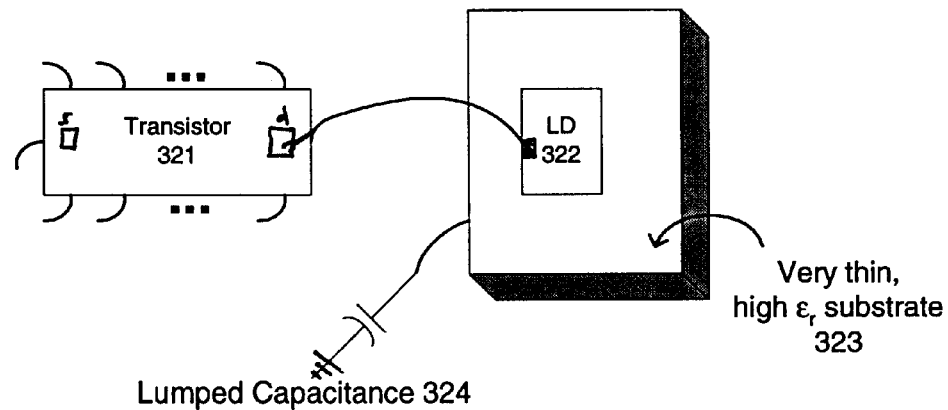

In one embodiment, the transistor is biased by an in-series laser diode. In another embodiment, split ground plane biasing approach is used. FIG. 4 shows two circuit configurations (310 and 320) of this biasing approach. In configuration 310, capacitive loadings 313 are added in between the transistor 311 and laser diode 312. In one embodiment, the drain of transistor 311 is coupled to laser diode 322 in an nvp (p-side down) position. In configuration 320, laser diode 322, connected to transistor 321, is fabricated on very thin substrate 323 with high permittivity. Lumped capacitor 324 is connected to the laser diode 322 through the substrate 323.

In one embodiment, the circuit may have a differential input. One of the inputs may be terminated. Such an embodiment, however, burns more power.

Figure 5:
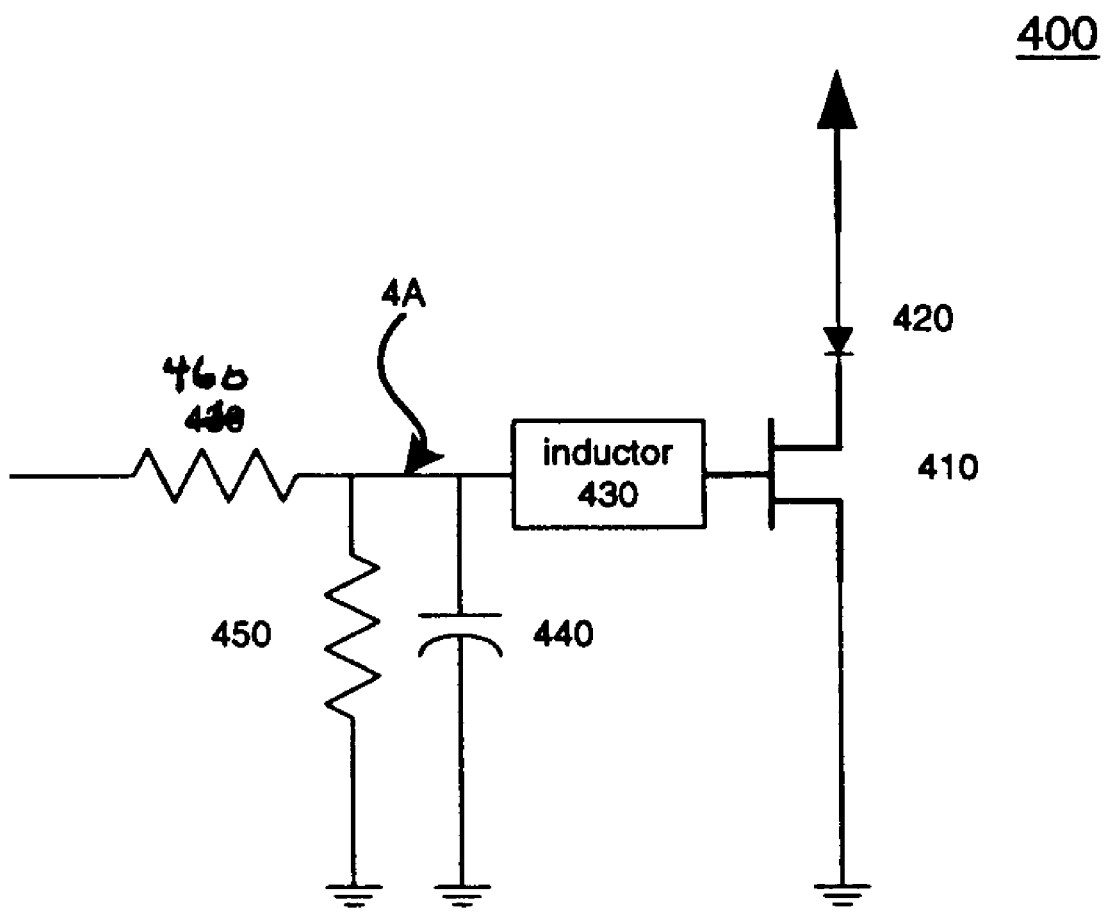
FIG. 5 shows one embodiment of the direct-drive modulator driver.

FIG. 5 shows a circuit diagram of another embodiment of the direct-drive modulator driver. A transistor 410 is connected with a laser diode 420 at one terminal and grounded at the other terminal. An input load, made up of a combination of resistors (resistor 450 and resistor 460), inductor 430 and capacitor 440, is connected between transistor 410 and an input signal. Inductor 430 is connected between node 4A and the gate terminal of transistor 410 (or the base terminal, depending on the type of transistor used). Capacitor 440 is connected between node 4A and ground. Resistor 450 is connected between node 4A and ground. Resistor 460 is connected to node 4A. An input signal is applied to the other end of resistor 460 to drive the transistor 410. The transistor 410 generates an amplified current through its other terminals, proportional to the input signal. In one embodiment, resistor 450 has a resistance of 50 ohms, and resistor 460 has a resistance of 10 ohms. In one embodiment, transistor 410 is a PHEMT.

Figure 6:
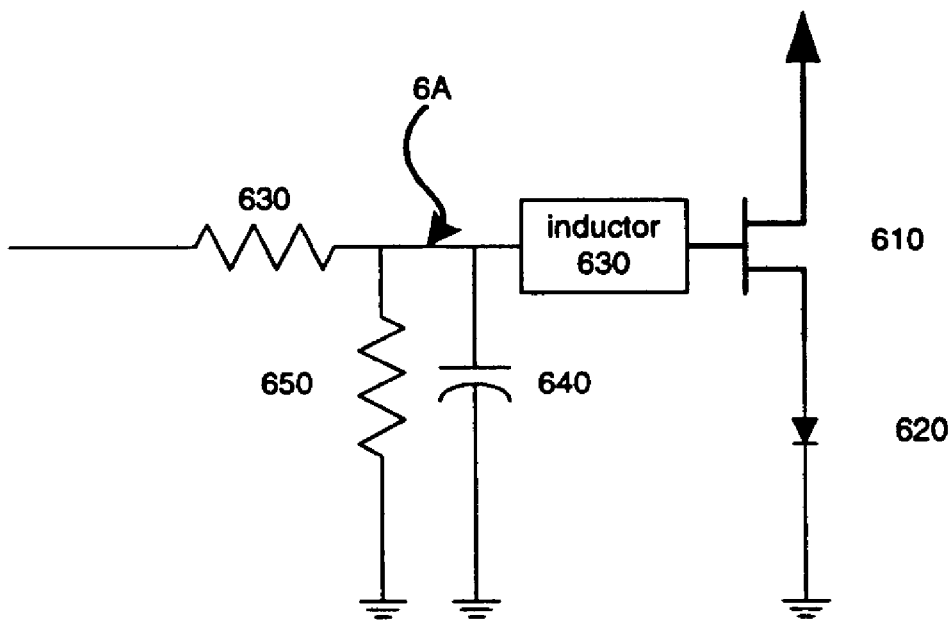
FIG. 6 shows one embodiment of the direct-drive modulator driver.

FIG. 6 shows a circuit diagram of one embodiment of a direct-drive modulator driver. A transistor 610 has a base terminal (or the gate terminal, depending on the type of transistor used), a first terminal and a second terminal. The first terminal is connected to an external power supply. A laser diode 620 has a p-terminal and an n-terminal. The p-terminal is connected to the second terminal of the transistor 610. The n-terminal is grounded. An input load made up of a combination of resistors (resistor 650 and resistor 660), inductor 630 and capacitor 640 is connected between an input signal and the transistor 610. The inductor 630 is connected between node 6A and the base terminal of transistor 610. The capacitor 640 is connected between node 6A and ground. The resistor 650 is connected between node 6A and ground. The resistor 660 is connected to node 6A. An input signal is applied to the other end of the resistor 660 to drive the transistor 610. The transistor 610 will generate an amplified current through the other terminals of it, proportional to the input signal. In one embodiment, the transistor 610 is a PHEMT. In another embodiment, the transistor 610 is a HBT. This configuration is more suitable for high voltage situation because it can drive capacitance effectively, and thus, similar to a voltage source driver. Although the current gain of this configuration is high, the voltage gain is only less than or equal to 1.

Figure 7:
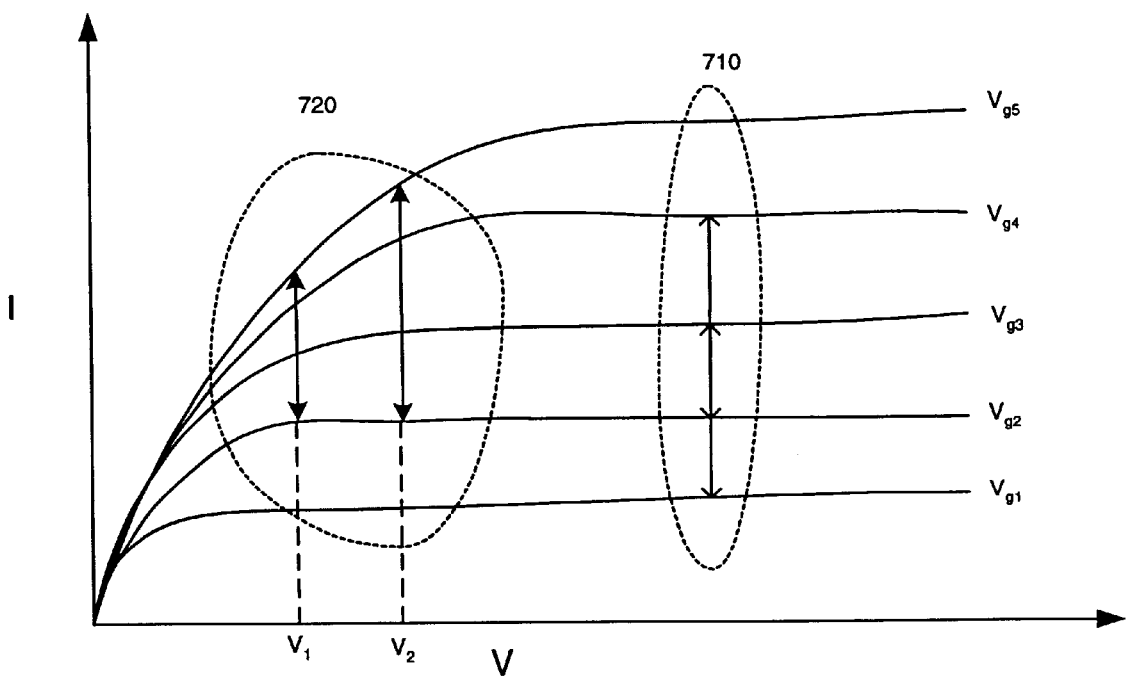
FIG. 7 shows an I–V curve of a typical transistor.

To independently control laser diode bias current ($I_d$) and bias current swing ($\Delta I_d$) in a direct diode driver, one can adjust the gate voltage and/or the drain voltage. FIG. 7 shows a current versus voltage curve (I–V curve) of a typical transistor, e.g. PHEMT, MESFET, etc. The bias point can be varied by changing the gate bias voltage (section 710), where $V_{g5}$ is greater than $V_{g4}$, $V_{g4}$ is greater than $V_{g3}$ and so on. The current swing ($\Delta I_d$) can be varied by changing the drain bias voltage and/or gate voltage. Arrows in section 720 show $\Delta I_d$ at drain bias voltage $V_1$ and drain bias voltage $V_2$.

This technique can be applied to HBT as well, where the bias point is controlled by varying the base current bias, and the current swing is controlled by varying the collector voltage bias. In this case, the device capacitance ($C_{bc}$) may become too large at low $V_{ce}$. However, reducing output impedance makes $C_{bc}$ non-critical.

Figure 8A:
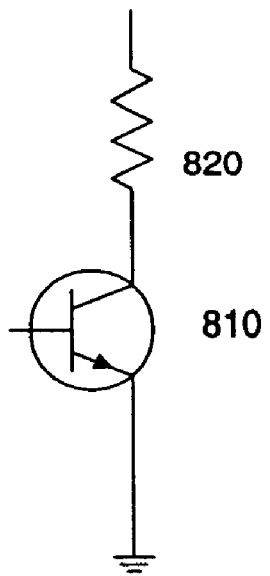
FIG. 8A shows one embodiment of circuit to soften the "knee" of an I–V curve.
Figure 8B:
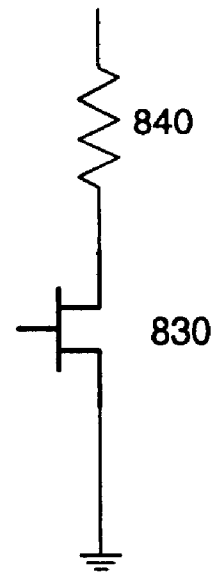
FIG. 8B shows one embodiment of circuit to soften the "knee" of an I–V curve.

Furthermore, since the "knee" of the I–V curve may be steep and difficult to control, a resistor can be connected in series with the collector terminal of the transistor to soften it. Two circuit configurations for softening the "knee" of an I–V curve are shown in FIGS. 8A and 8B. In FIG. 8A, a resistor 820 is connected in series with the collector of the HBT 810. In FIG. 8B, a resistor 840 is connected in series with the source of the transistor 830. The series resistor will, however, increase power dissipation of the circuit. A large resistance may also reduce available swing. It may also make the device output capacitance ($C_{ds}$ of the FET; $C_{bc}$ of the HBT) more significant.

Various embodiments of a direct-drive modulator driver and an optical transponder with the driver incorporated have been described. One intended advantage of the design is to reduce power consumption by the driver. In particular, this low-power design allows a direct-drive modulator driver to be packaged with other components of an optical transponder in order to reduce the over-all size of the optical fiber communication system and to cut cost.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

We claim:

1. A driver, comprising:
   an input;
   an output;
   a transistor having a first terminal, a second terminal and a third terminal, wherein the first terminal is coupled to ground and the second terminal is coupled to the output;
   a laser diode having a p-terminal and an n-terminal, wherein the p-terminal is coupled to a power supply, and the n-terminal coupled to the second terminal of the transistor; and
   an input load coupled to the input and the third terminal of the transistor, the input load comprising an inductor coupled to the third terminal of the transistor.

2. The driver defined in claim 1 wherein the transistor comprises a CMOS transistor.

3. The driver defined in claim 1, wherein the transistor is a heterojunction bipolar transistor (HBT).

4. The driver defined in claim 1, wherein the transistor is a pseudomorphic high electron mobility transistor (PHEMT).

5. The driver according to claim 1, wherein the input load further comprises:
   a capacitor coupled between the inductor and ground;
   a first resistor coupled between the inductor and ground; and
   a second resistor coupled between the inductor and an input signal.

6. A direct-drive modulator driver comprising:
   an input;
   an output;
   a transistor having a first terminal, a second terminal, and a third terminal, the second terminal coupled to ground and the first terminal coupled to the output;
   a laser diode having a p-terminal and an n-terminal, the p-terminal for coupling to a first power supply, and wherein the n-terminal is coupled to the first terminal of the transistor;
   an inductor coupled between a second power supply and the p-terminal of the laser diode; and
   an input load coupled between the third terminal of the transistor and the input.

7. The direct-drive modulator driver in claim 6, wherein the transistor is a heterojunction bipolar transistor (HBT).

8. The direct-drive modulator driver in claim 6, wherein the transistor is a pseudomorphic high electron mobility transistor (PHEMT).

9. The direct-drive modulator driver in claim 6, wherein the input load comprises:
   an inductor coupled to the third terminal of the transistor;
   a capacitor coupled between the inductor and ground;
   a first resistor coupled between the inductor and ground; and
   a second resistor coupled between the inductor and an input signal.

10. A transponder comprising:
    a receiver;
    a transmitter comprising an optic transmitter and a driver, wherein the driver comprises
       a transistor having a first terminal, a second terminal, and a third terminal, the first terminal coupled to a power supply;
       a laser diode having a p-terminal and a n-terminal, wherein the p-terminal is coupled to the second terminal of the transistor and the n-terminal is coupled to ground; and
       an input load coupled to the third terminal of the transistor.

11. The transponder defined in claim 10, wherein the transistor is a HBT.

12. The transponder defined in claim 10, wherein the transistor is a PHEMT.

13. The transponder defined in claim 10, wherein the input load comprises:
    an inductor coupled to the third terminal of the transistor;
    a capacitor coupled between the inductor and ground;
    a first resistor coupled between the inductor and ground; and a second resistor coupled between the inductor and an input signal.

14. A driver, comprising:

an input;

an output;

a transistor having a first terminal, a second terminal, and a third terminal, wherein the first terminal is coupled to a power supply and the second terminal is coupled to the output;

a laser diode having a p-terminal and a n-terminal, wherein the p-terminal is coupled to the second terminal of the transistor and the n-terminal is coupled to ground; and an input load coupled between the third terminal of the transistor and the input.

15. The driver according to claim 14, wherein the transistor is a HBT.

16. The driver according to claim 14, wherein the transistor is a PHEMT.

17. The driver according to claim 14, wherein the input load comprises:

an inductor coupled to the third terminal of the transistor;

a capacitor coupled between the inductor and ground;

a first resistor coupled between the inductor and ground; and a second resistor coupled between the inductor and an input signal.

* * * * *